(12) United States Patent
Jeong et al.

(10) Patent No.: US 10,853,169 B2
(45) Date of Patent: Dec. 1, 2020

(54) MEMORY CONTROLLER, SEMICONDUCTOR MEMORY SYSTEM INCLUDING THE SAME, AND METHOD OF DRIVING THE SEMICONDUCTOR MEMORY SYSTEM

(71) Applicant: SK hynix Inc., Icheon (KR)

(72) Inventors: Seung-Gyu Jeong, Icheon (KR); Do-Sun Hong, Icheon (KR); Jung-Hyun Kwon, Seoul (KR); Won-Gyu Shin, Icheon (KR)

(73) Assignee: SK hynix Inc., Icheon (KR)

( * ) Notice: Subject to any disclaimer, the term of this patent is extended or adjusted under 35 U.S.C. 154(b) by 178 days.

(21) Appl. No.: 16/029,083

(22) Filed: Jul. 6, 2018

(65) Prior Publication Data

US 2019/0146871 A1    May 16, 2019

(30) Foreign Application Priority Data

Nov. 10, 2017 (KR) .................. 10-2017-0149743

(51) Int. Cl.
| G06F 11/00 | (2006.01) |
| G06F 11/10 | (2006.01) |
| G06F 3/06 | (2006.01) |
| G06F 12/1009 | (2016.01) |
| G11C 8/06 | (2006.01) |
| G11C 29/52 | (2006.01) |

(52) U.S. Cl.
CPC .......... *G06F 11/1068* (2013.01); *G06F 3/064* (2013.01); *G06F 3/0619* (2013.01); *G06F 3/0679* (2013.01); *G06F 11/1048* (2013.01); *G06F 12/1009* (2013.01); *G11C 8/06* (2013.01); *G06F 2212/1008* (2013.01); *G06F 2212/657* (2013.01); *G11C 29/52* (2013.01)

(58) Field of Classification Search
CPC .. G06F 11/1068; G06F 11/1048; G06F 3/064; G06F 12/1009; G06F 3/0679; G06F 3/0619; G06F 2212/1008; G06F 2212/657; G06F 12/0246; G06F 2212/7201; G06F 2212/7207; G11C 8/06; G11C 29/52
USPC ................................................. 714/764, 763
See application file for complete search history.

(56) References Cited

U.S. PATENT DOCUMENTS

| 5,771,194 | A * | 6/1998 | Maeno .................... G11C 29/18 365/200 |
| 7,352,621 | B2 * | 4/2008 | Rothman ................ G11C 29/76 365/185.09 |
| 9,502,129 | B1 * | 11/2016 | Suzuki .................. G06F 3/0619 |
| 10,025,724 | B1 * | 7/2018 | Koo ..................... G06F 12/1009 |
| 10,109,372 | B2 * | 10/2018 | Kern ....................... G11C 29/52 |
| 2016/0225461 | A1 | 8/2016 | Tuers et al. |
| 2016/0343431 | A1 * | 11/2016 | Lesartre ............... G11C 13/004 |

(Continued)

FOREIGN PATENT DOCUMENTS

| KR | 20110001883 A * | 1/2011 | ......... G11C 13/0035 |
| KR | 10-2017-0075355 A | 7/2017 | |

*Primary Examiner* — Albert Decady
*Assistant Examiner* — Osman M Alshack

(57) ABSTRACT

A memory controller may include an address control block. The address control block may be configured to remap a write target address when a number of write data having a first logic level is within a correctable range and when a level of a datum corresponding to the write target address has the first logic level.

17 Claims, 10 Drawing Sheets

(56) References Cited

U.S. PATENT DOCUMENTS

2017/0255389 A1* 9/2017 Tan ..................... G06F 3/0605
2018/0143922 A1   5/2018 Hong

* cited by examiner

MEMORY CONTROLLER, SEMICONDUCTOR MEMORY SYSTEM INCLUDING THE SAME, AND METHOD OF DRIVING THE SEMICONDUCTOR MEMORY SYSTEM

CROSS-REFERENCES TO RELATED APPLICATION

The present application claims priority under 35 U.S.C. § 119(a) to Korean Patent Application 10-2017-0149743, filed in the Korean Intellectual Property Office on Nov. 10, 2017, which is incorporated herein by reference in its entirety.

BACKGROUND

1. Technical Field

Various embodiments of the present disclosure may generally relate to a memory controller, a semiconductor memory system including the same, and a method of driving the semiconductor memory system. More particularly, embodiments of the present disclosure relate to a memory controller configured to control a resistive variable memory device, a semiconductor memory system including the memory controller, and a method of driving the semiconductor memory system.

2. Related Art

With increasing demands for memory devices with high capacity and low power consumption, research on next-generation memory devices have been conducted. These next-generation memory devices may be non-volatile devices that may not require refresh operations.

Next-generation memory devices may have a variety of requirements. For example, next-generation memory devices may require the high capacity characteristics of dynamic random access memories (DRAMs), the nonvolatile characteristics of flash memories, and the high speed of static random access memories (SRAMs).

Examples of next-generation memory devices include phase-change RAM (PCRAM) devices, nano floating gate memory (NFGM) devices, polymer RAM (PoRAM) devices, magnetic RAM (MRAM) devices, ferroelectric RAM (FeRAM) devices, resistive RAM (ReRAM) devices, and the like. Specifically, next-generation memory devices may include resistive variable memory devices.

In a specific example, a next-generating memory device may include a plurality of memory cells similarly to a DRAM device. The memory cells may be arranged into a plurality of groups, such that the memory device may include the groups of the memory cells. Each of the groups of the memory cells may be referred to as a cell array or an MAT. Further, the memory device may include a control circuit configured to individually drive each of the cell arrays.

However, a reading error may occur when data in the memory cells adjacent to the control circuit (hereinafter, an "adjacent memory cell") are read, due to a reading disturbance.

SUMMARY

Example embodiments of the present disclosure provide a memory controller that is capable of preventing a reading disturbance of memory cells adjacent to a control circuit.

Example embodiments also provide a semiconductor memory system including the above-mentioned memory controller.

Example embodiments still also provide a method of driving the above-mentioned semiconductor memory system.

In example embodiments of the present disclosure, a memory controller may include an address control block. The address control block may be configured to remap a write target address when a number of write data having a first logic level is within a correctable range and when a level of a datum corresponding to the write target address has the first logic level. At that time, the memory controller stores the write data in a memory device.

In example embodiments of the present disclosure, a semiconductor memory system may include a memory device and a memory controller. The memory device may include a memory cell array and a control circuit block, the memory cell array including a plurality of memory cells arranged in a matrix shape with n rows and m columns, m and n being positive integers, the control circuit block being arranged at an edge portion of the memory cell array. The memory controller may be configured to provide the memory device with write data, a read command, a write command, and addresses providing positions at which the write data is written in the memory device. The memory controller may include an error correction code (ECC) block configured to correct the read data.

The memory controller may include a data determination block and an address control block. The data determination block may be configured to generate an address change signal when a number of the write data having a first logic level is within a correctable range of the ECC circuit. The address control block may be configured to remap a write target address with an address of a memory cell adjacent to the control circuit block in a write operation when a datum corresponding to the write target address has the first logic level and when the adjacent memory cell is empty, and to select, in a read operation, one of a read target address and a remapping address based on remapping information of the read target address.

In example embodiments of the present disclosure, there may be provided a method of driving a semiconductor memory system, the semiconductor memory system may include a memory device and a memory controller. The memory device may include a memory cell array and a control circuit block. The memory cell array may include a plurality of memory cells. The control circuit block may be arranged at an edge portion of the memory cell array. The memory controller may be configured to control operations of the memory device. The method of driving the semiconductor memory system comprises counting a number of write data having a first logic level, determining whether the number of the write data having the first logic level is within a correctable range, remapping a write target address on an address of one of the memory cells adjacent to the control circuit block when the number of the write data having the first logic level is determined to be within the correctable range and a datum corresponding to the write target address has the first logic level, and storing the datum of the write target address in the adjacent memory cell corresponding to the remapped address.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present disclosure will be described in greater detail with reference to the accompanying drawings. The drawings are schematic illustrations of various structures according to various embodiments of the present disclosure, and also include illustrations of intermediate structures. As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of various embodiments of the appended claims.

Embodiments of the present disclosure are described herein with reference to cross-section and/or plan illustrations, which may be idealized embodiments of the present disclosure. However, embodiments of the present disclosure should not be construed as limiting the inventive concept of the disclosure. Although a few embodiments of the present disclosure will be shown and described, it will be appreciated by those of ordinary skill in the art that changes may be made in these embodiments without departing from the principles and spirit of various embodiments of the present disclosure.

Figure 1:
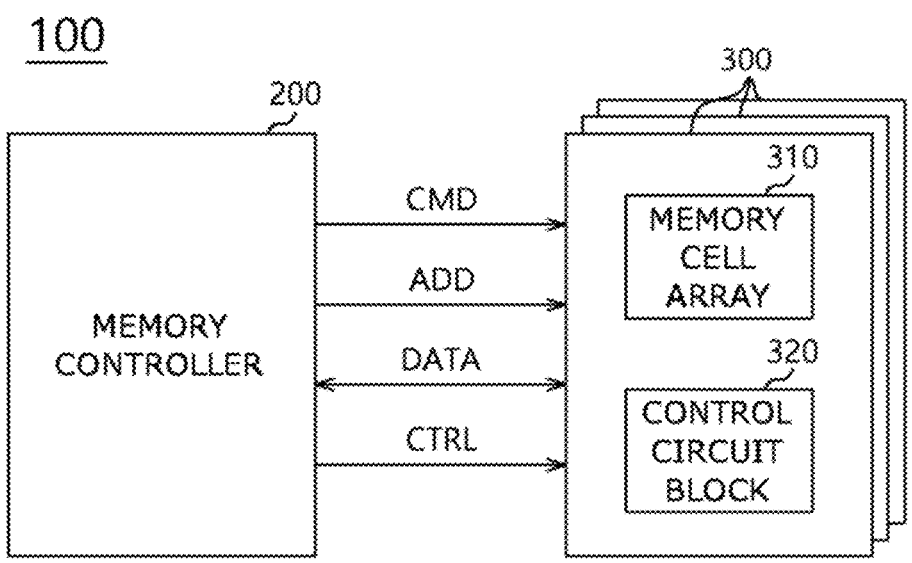
FIG. 1 is a block diagram illustrating a semiconductor memory system in accordance with an embodiment of the present disclosure.

FIG. 1 is a schematic block diagram illustrating a semiconductor memory system 100 according to an embodiment of the present disclosure.

Referring to FIG. 1, the semiconductor memory system 100 may include a memory controller 200 and at least one semiconductor memory device 300.

The memory controller 200 may receive a read request, a write request, or both, from an application, an operating system (OS), or both. The memory controller 200 may provide an address ADD, a command CMD, data DATA, and at least one control signal CTRL to the semiconductor memory device 300. For example, the memory controller 200 may transmit the address ADD, the command CMD, the data DATA, and the control signal CTRL, through a command bus, a data channel, and an address bus, respectively. The command bus, the data channel, and the address bus may share at least one electrical signal line.

The memory controller 200 may be interfaced with the semiconductor memory device 300. The memory controller 200 may receive and transmit data DATA from and to the memory device 300 in response to the read request and the write request, respectively.

Figure 2:
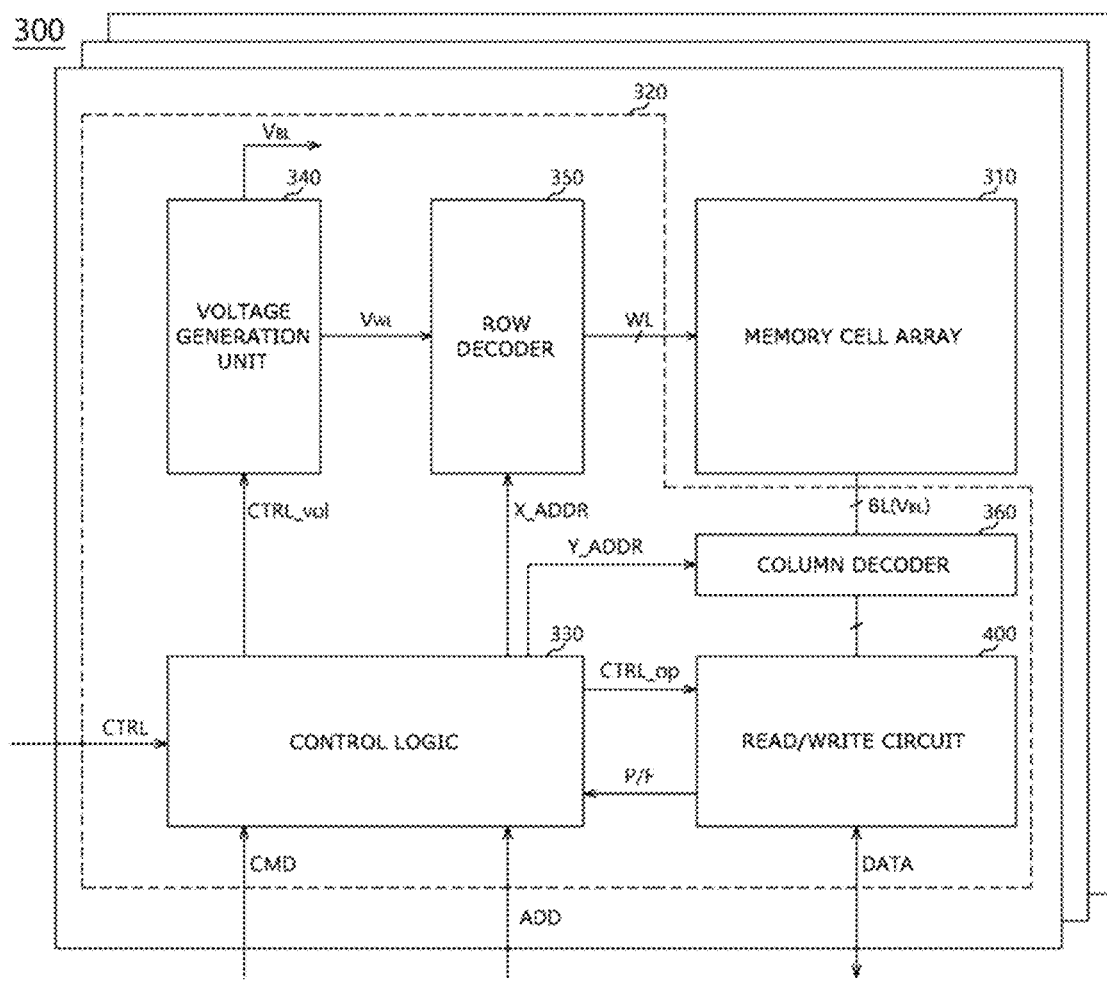
FIG. 2 is a detailed block diagram illustrating a memory device in the semiconductor memory system of FIG. 1 according to an embodiment of the present disclosure.

FIG. 2 is a detailed block diagram illustrating a memory device 300 included in the semiconductor memory system 100 of FIG. 1 according to an embodiment of the present disclosure.

Referring to FIG. 2, the semiconductor memory device 300 may be a single device, or may be one of a plurality of semiconductor memory devices. The semiconductor memory device 300 may include a memory cell array 310 and a control circuit block 320.

The memory cell array 310 may include a plurality of first signal lines, a plurality of second signal lines, and a plurality of memory cells coupled between the plurality of first signal lines and the plurality of second signal lines. The memory cell array 310 may be a cross-point-type memory cell array. For example, the first signal lines may be bit lines and the second signal lines may be word lines. In another example, the first signal lines may be the word lines and the second signal lines may be the bit lines.

Figure 3:
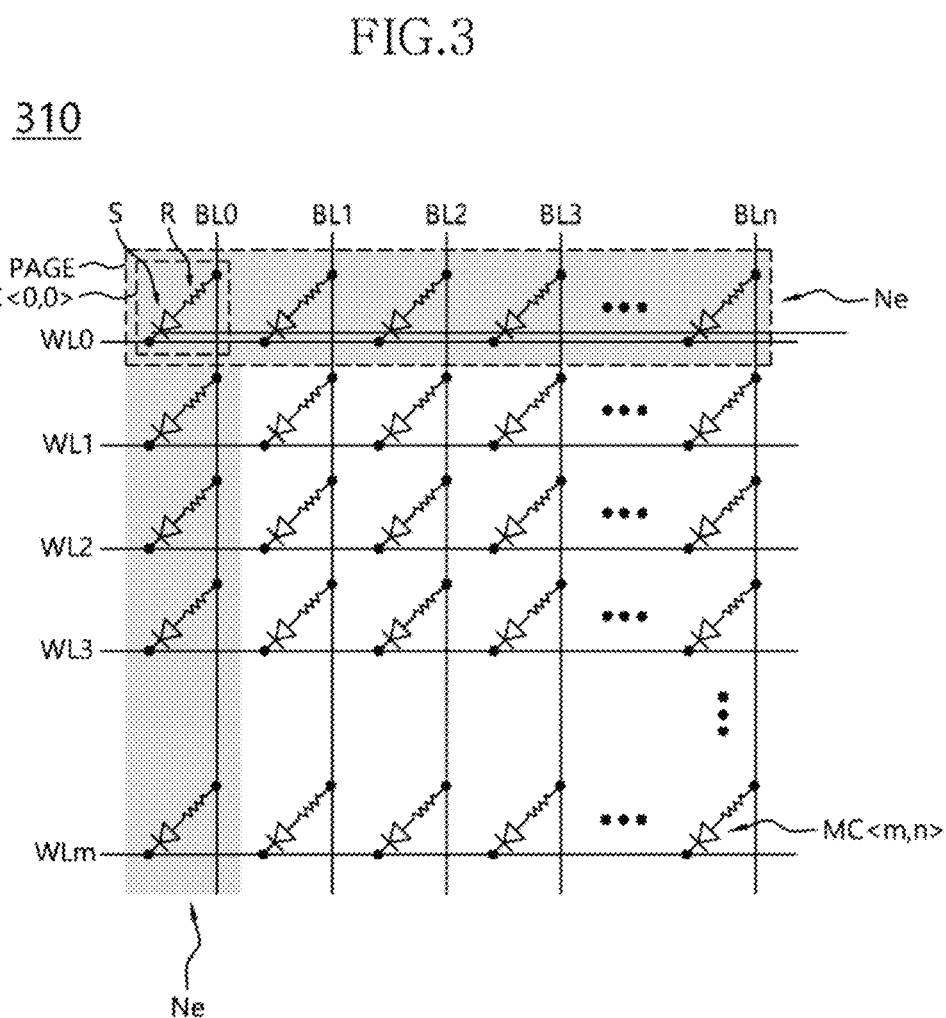
FIG. 3 is a detailed circuit diagram illustrating a memory cell array in the memory device of FIG. 2 according to an embodiment of the present disclosure.

FIG. 3 is a detailed circuit diagram illustrating the memory cell array of FIG. 2 according to an embodiment of the present disclosure.

Referring to FIG. 3, the memory cell array 310 may include a plurality of word lines WL0 to WLm, a plurality of bit lines BL0 to BLn, and a plurality of memory cells MC<0,0> to MC<m,n>, m and n being positive integers. In various embodiments, the number of word lines, bit lines, and memory cells may be varied according to the integration degree of a memory device in which the memory cell array 310 is included. The memory cell array 310 may be implemented in a 2D form or a 3D form.

Each memory cell MC may include a selection element S and a variable resistor R.

The selection element S may be coupled between any one of the plurality of word lines WL0 to WLm and the variable resistor R corresponding to the one word line. The selection element S may control a current supplied to the variable resistor R according to voltages applied to the word line WL and any one of the plurality of bit lines BL0 to BLn, which is coupled to the selection element S. For example, the selection element S in the embodiment may be a diode or a MOS transistor. In another example, an ovonic threshold switch (OTS) including a phase-change memory layer may be used as the selection element S.

The variable resistor R may be coupled to the selection element S and to one of the plurality of bit lines BL0 to BLn. However, embodiments are not limited thereto. In an embodiment, the selection element S may be coupled to one of the plurality of bit lines BL0 to BLn, and the variable resistor R may be coupled to one of the plurality of word lines WL0 to WLm.

The variable resistor R may have one among a plurality of resistance states in response to an electrical pulse applied to the bit line BL. The electrical pulse may be, for example, a voltage or current. The variable resistor R may include a phase-change material layer or a resistance change material layer, which has a crystalline state that is changed according to an amount of an applied current. The phase-change material layer may include any of various compounds that combine various types of elements, for example, a compound including two elements that are combined, such as GaSb, InSb, InSe, $Sb_2Te_3$, or GeTe; a compound including three elements that are combined, such as GeSbTe, GaSeTe, InSbTe, $SnSb_2Te_4$, or InSbGe; a compound including four elements that are combined, such as AgInSbTe, (GeSn)SbTe, GeSb(SeTe), or $Te_{81}Ge_{15}Sb_2S_2$; and the like.

The phase-change material layer may have an amorphous state and a crystalline state. The amorphous state may have a relatively high resistance and the crystalline state may have a relatively low resistance. That is, the phase-change material layer may have a greater electrical resistance in the amorphous state than in the crystalline state. A phase of the phase-change material layer may be changed according to Joule's heat generated by an amount of current applied to the phase-change material layer, and a cooling time.

For example, each memory cell may be a signal level cell, and may store 1-bit data or a 1-bit datum. For example, each memory cell may have two possible resistance states corresponding to the two possible data levels that can be stored in the memory cell. That is, the memory cell may store a datum of '0' when the memory cell is in a low resistance state, and may store a datum of '1' when the memory cell is in a high resistance state. In another example, each memory cell may be a multi-level cell which stores 2-bit data or more than 2 bits of data. In this example, the memory cell may have four to eight possible resistance states corresponding to the possible data levels that can be stored in the memory cell.

In embodiments, memory cells (MC<0,0~n>, MC<0~m, 0>) that are adjacent to the control circuit block 320, among the memory cells MC<0,0> to MC<m,n> in the memory cell array 310, may be referred to as "adjacent memory cells" or cells in a "near cell region."

Figure 4:
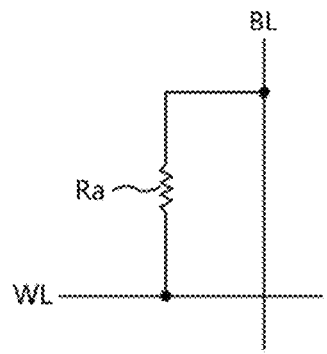
FIGS. 4 to 6 are circuit diagrams illustrating modified examples of a memory cell of FIG. 3 according to embodiments of the present disclosure.
Figure 5:
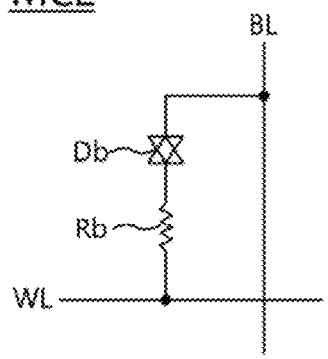
Figure 6:
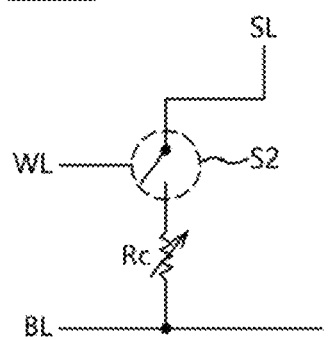

FIGS. 4 to 6 are circuit diagrams illustrating modified examples of the memory cell MC of FIG. 3 according to embodiments of the present disclosure.

Referring to FIG. 4, a memory cell MC1 may include a variable resistor Ra coupled between a word line WL and a bit line BL. The variable resistor Ra may be selectively operated according to a voltage difference between the word line WL and the bit line BL.

Referring to FIG. 5, a memory cell MC2 may include a variable resistor Rb and a bidirectional diode Db. The bidirectional diode Db may be a selection element. The bidirectional diode Db may be coupled between a bit line BL and the variable resistor Rb. The variable resistor Rb may be coupled to a word line WL. The positions of the bidirectional diode Db and the variable resistor Rb with respect to each other may be changed. A leakage current flowing through the memory cell MC2 when the memory cell MC2 is a non-selected resistive memory cell may be blocked by the bidirectional diode Db.

Referring to FIG. 6, a memory cell MC3 may include a variable resistor Rc and a 3-phase switch S2. The 3-phase switch S2 may be configured to supply and block a current between a source line SL and the variable resistor Rc according to a voltage of a word line WL. The variable resistor Rc may be coupled to a bit line BL. The 3-phase switch S2 may include a transistor or an OTS switch. When the 3-phase switch is used as a selection element, the source line SL may be further connected to the 3-phase switch S2, and may control voltage levels of both ends of the variable resistor Rc. The arrangement position of the 3-phase switch S2 and the variable resistor Rc with respect to each other may be changed.

Referring to back to FIG. 3, the memory cell array 310 may include a plurality of pages PAGE. The pages PAGE may refer to a set of memory cells MC that are accessible through one row address and that are coupled to the same signal line, e.g., the same word line. For example, one page PAGE may include a set of the memory cells MC<0,0> to MC<0,n> that are connected to the word line WL0. Each of the pages PAGE may include a plurality of memory cells. The number of memory cells included in each page PAGE may be variously set according to various embodiments.

Referring back to FIG. 2, the control circuit block 320 may include a control logic 330, a voltage generation unit 340, a row decoder 350, a column decoder 360, and a read/write circuit 400.

The control logic 330 may generate various control signals for writing data DATA in the memory cell array 310, for reading data DATA from the memory cell array 310, or both. The control signals may be generated based on a command CMD, an address ADD, and a control signal CTRL, which are received by the control logic 330 from a memory controller, e.g., the memory controller 200 illustrated in FIG. 1. The various control signals may be provided to the read/write circuit 400, the voltage generation unit 340, the row decoder 350, and the column decoder 360. Accordingly, the control logic 330 may control an overall operation of the memory device 300.

The control logic 330 may control the read/write circuit 400 by providing operation control signals CRTL_op to the read/write circuit 400. For example, the operation control signals CRTL_op may include any of a write enable signal, a read enable signal, a sensing enable signal, a discharge enable signal, a precharge enable signal, and the like. The control logic 330 may generate a voltage control signal CTRL_vol and may provide the generated voltage control signal CTRL_vol to the voltage generation unit 340. The control logic 330 may provide a row address X_ADDR to the row decoder 350 and may provide a column address Y_ADDR to the column decoder 360.

The voltage generation unit 340 may generate various types of voltages based on the voltage control signal CTRL_vol and provide the generated voltages to the memory cell array 310. The generated voltages may initiate and/or control a write operation, a read operation, an erase operation, a verify operation, or a combination thereof. For example, the voltage generation unit 340 may generate a word line driving voltage VWL for driving a plurality of word lines WL to the row decoder 350 and may generate a bit line driving voltage $V_{BL}$ for driving a plurality of bit lines BL to the column decoder 360. The word line driving voltage VwL and/or the bit line driving voltage $V_{BL}$ may include any of a reset write voltage, a set write voltage, an inhibit voltage, a read voltage, a verify voltage, and the like.

The row decoder 350 may be configured to receive the row address X_ADDR from the control logic 330, and to activate a word line selected from among the plurality of word lines WL in response to the row address X_ADDR.

The column decoder 360 may be configured to receive the column address Y_ADDR from the control logic 330, and to activate a bit line selected from among the plurality of bit lines BL in response to the column address Y_ADDR.

Figure 7:
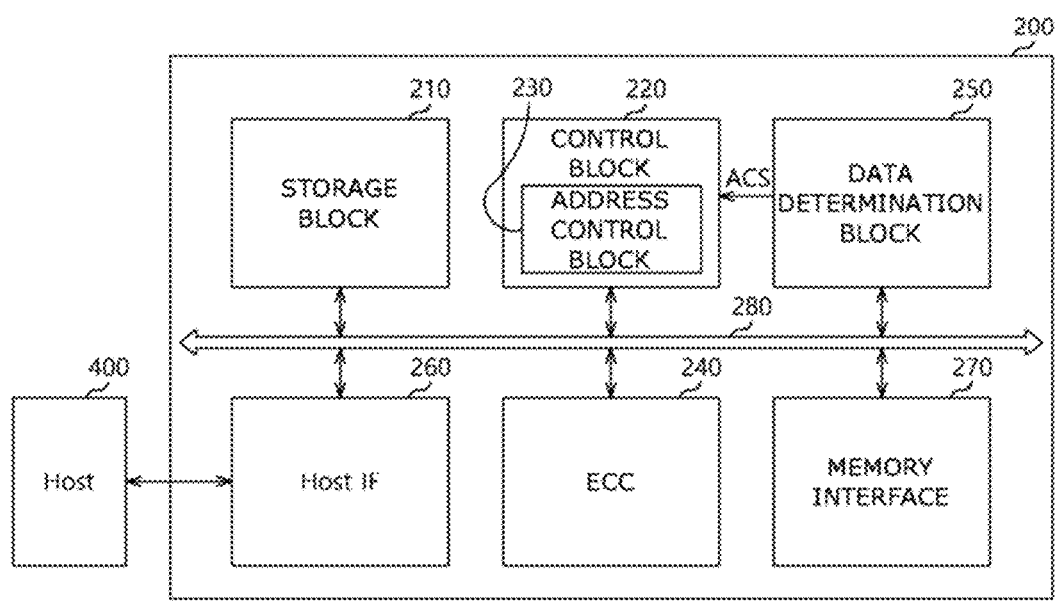
FIG. 7 is a block diagram illustrating a memory controller in accordance with an embodiment of the present disclosure.

FIG. 7 is a block diagram illustrating a memory controller 200 in accordance with an embodiment of the present disclosure.

Referring to FIG. 7, the memory controller 200 may be configured to control a read operation and a write operation of data in a memory device, e.g., the memory device 300 illustrated in FIG. 2. For example, the memory controller 200 may control the memory device 300 in response to a request from a host device 400. The memory controller 200 may provide the host device 400 with data read from the memory device 300. The memory controller 200 may store data provided from the host device 400 in the memory device 300.

The memory controller 200 may include a storage block 210, a control block 220, an error correction code (ECC) block 240, a data determination block 250, a host interface 260, and a memory interface 270. The storage block 210, the control block 220, the ECC block 240, the data determination block 250, the host interface 260, and the memory interface 270 may be coupled with each other through a bus 280.

The storage block 210 may function as a working memory of a memory system, e.g., the memory system 100 illustrated in FIG. 1, and the memory controller 200 included in the memory system 100. The storage block 210 may be configured to store data for driving the memory system 100 and the memory controller 200. When the memory controller 200 may control the operations of the memory device 300, the storage block 210 may store data that is used by the memory controller 200 and the memory device 300 for a read operation, a write operation, a programming operation, an erasing operation, or a combination thereof.

The storage block 210 may include a non-volatile memory. The storage block 210 may include an SRAM or a DRAM. The storage block 210 may temporarily store data, which can be write data that is received from the host device 400 and is to be written in the memory device 300 during a write operation, which can be read data that is read from the memory device 300, or a combination thereof. In order to store the data, the storage block 210 may include a program memory, a data memory, a write buffer, a read buffer, a map buffer, etc.

The control block 220 may be configured to control general operations of the memory system 100 as well as the read and write operations of the memory device 300 in response to the write request or the read request from the host device 400. The control block 220 may drive firmware as a flash translation layer (FTL) for controlling the general operations of the memory system 100. For example, the FTL may perform a logical to physical (L2P) mapping operation, a wear leveling operation, a garbage collection operation, a bad block handling operation, etc. The L2P mapping operation may be known as a logical block addressing (LBA).

The control block 220 may include an address control block 230. The address control block 230 may be configured to remap (or change) a write target address with an adjacent cell address in response to an address change signal ACS, which is provided from the data determination block 250.

Particularly, the address control block 230 may remap the write target address with the adjacent cell address of the adjacent memory cell in the write operation in response to the address change signal ACS when a data level of the write target address corresponds to a specific data level having a high error generation probability and when no data is stored in the adjacent memory cell. As used herein, a memory cell is "empty" when the memory cell is not storing any data.

The address control block 230 may select a read target address or a remapping address in the read operation based on remapping information of the read target address.

The address control block 230 may include a mapping table. The mapping table may show address remapping information of the adjacent memory cells.

Figure 8:
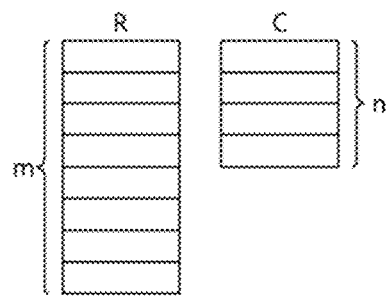
FIG. 8 is a mapping table in accordance with an embodiment of the present disclosure.

FIG. 8 is a mapping table 235 in accordance with an embodiment of the present disclosure.

Referring to FIG. 8, the mapping table 235 may include a row table R and a column table C. For example, when a memory cell array, e.g., the memory cell array 310 illustrated in FIG. 3, includes m rows of memory cells and n columns of memory cells, e.g., an m×n matrix of memory cells, the row table R may include m numbers of pages and the column table C may include n numbers of pages.

The row table R may store address information of the memory cells of each of the rows located at a zeroth column. The column table C may store address information of the memory cells of each of the columns located at a zeroth row.

Referring back to FIG. 7, the ECC block 240 may detect and correct errors in the data read by the memory device 300 in the read operation. When a number of error bits in the data is equal to or lower than a critical number N of correctable error bits, the ECC block 240 may correct the errors in the data. In contrast, when the number of the error bits is more than or equal to the critical number N of the correctable error bits, the ECC block 240 may not correct the errors in the data. When the ECC block 240 does not correct the errors in the data, the ECC block 240 may output an error correction fail signal that represents an error correction fail of the error bits.

In embodiments, the ECC block 240 may perform an error correction operation by modulating the data with a type of code, such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a block coded modulation (BCM), etc. The ECC block 240 may include circuits, systems, devices, or a combination thereof, for performing the error correction operation.

The data determination block 250 may transmit the address change signal ACS to the address control block 230 of the control block 220 when a number of data having a specific level is equal to or lower than the critical number N of the correctable error bits corresponding to the ECC block 240.

Figure 9:
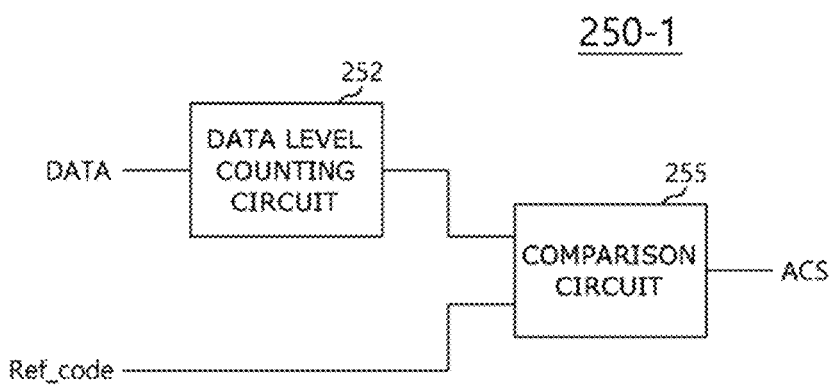
FIG. 9 is a detailed block diagram illustrating a data determination block in accordance with an embodiment of the present disclosure.

FIG. 9 is a detailed block diagram illustrating a data determination block 250-1 in accordance with an embodiment of the present disclosure.

Referring to FIG. 9, the data determination block 250-1 may include a data level counting circuit 252 and a comparison circuit 255.

The data level counting circuit 252 may receive data DATA that is to be inputted into a memory device, e.g., the memory device 300 illustrated in FIG. 2. For example, the data level counting circuit 252 may count a number of bits in data having a specific data level, e.g., a "0" level, among the inputted data DATA. The data level counting circuit 252 may output an output code representing the counted number. The output code may be a code signal.

The comparison circuit 255 may receive the output code of the data level counting circuit 252 and a reference code Ref_code. The comparison circuit 255 may compare the output code with the reference code Ref_code. The reference code Ref_code corresponds to a critical number N of correctable error bits of an ECC block, e.g., the maximum number of error bits that are correctable by the ECC block. Thus, when the comparison between the output code and the reference code Ref_code indicates that the number of bits having the 0 level in the inputted data DATA is equal to or lower than the critical number N of correctable error bits, the comparison circuit 255 may output the address change signal ACS.

Figure 10:
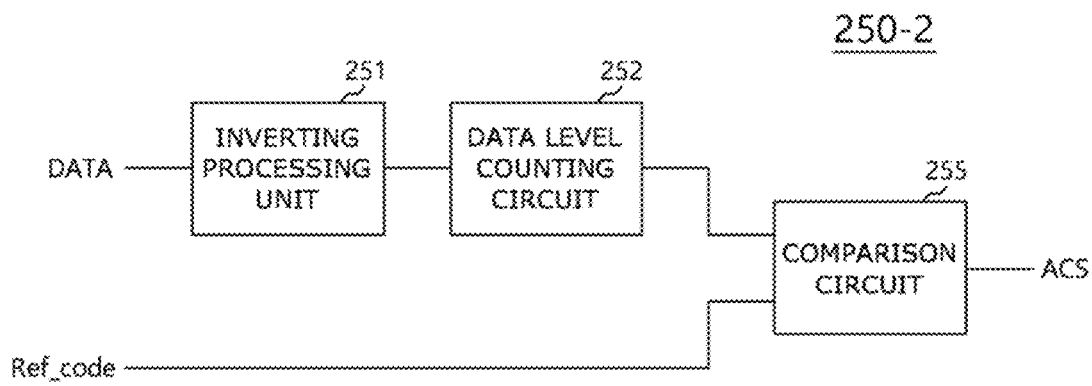
FIG. 10 is a detailed block diagram illustrating a data determination block in accordance with an embodiment of the present disclosure.

Alternatively, as shown in FIG. 10, a data determination block 250-2 may further include an inverting processing unit 251 that is installed at a front end of the data level counting circuit 252. The inverting processing unit 251 may count a number of bits having a level of "1" in the inputted data DATA. That is, when the number of bits having the 1 level in the inputted data DATA is equal to or lower than the critical number N of correctable error bits, the comparison circuit 255 may output the address change signal ACS.

Referring back to FIG. 7, the host interface 260 may communicate with the host device 400 through at least one of various interfaces operating according to various protocols, such as any of a universal serial bus (USB), a multimedia card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), an integrated drive electronics (IDE), etc.

The memory interface 270 may be configured to interface between the memory controller 200 and a memory device in response to a request from the host device 400. The memory interface 270 may generate control signals with respect to the memory device. The memory interface 270 may process data under the control of the control block 220.

Figure 11:
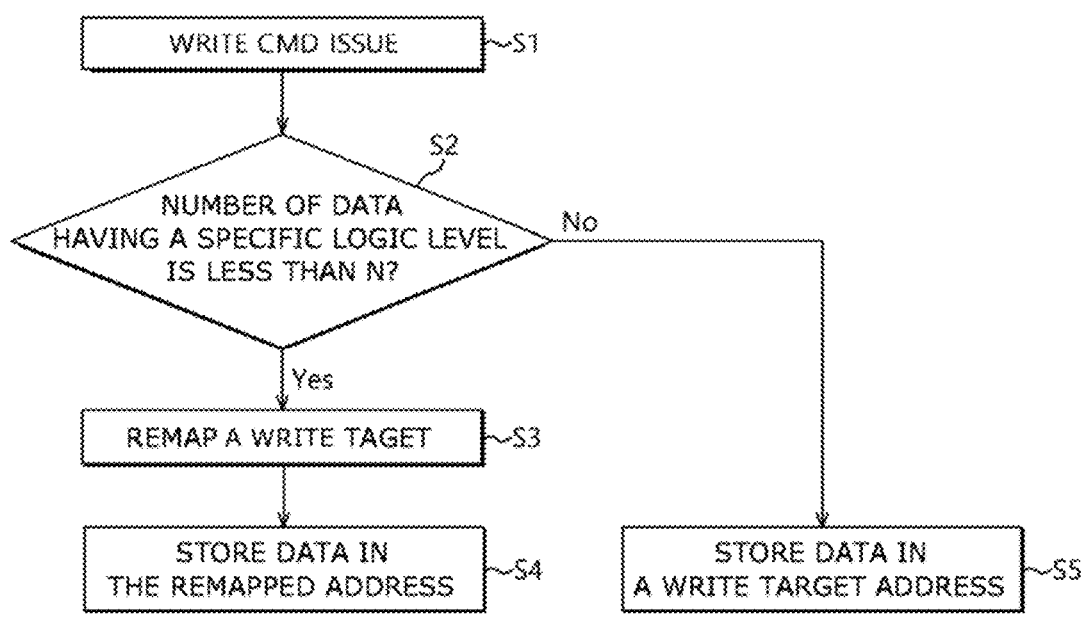
FIG. 11 is a flow chart illustrating a write operation of a resistive variable memory device in accordance with an embodiment of the present disclosure.

FIG. 11 is a flow chart illustrating a write operation of a resistive variable memory device in accordance with an embodiment of the present disclosure.

Referring to FIG. 11, in step S1, a memory controller may generate a write command for writing data in a memory device. In an example, the memory controller is the memory controller 200 illustrated in FIG. 7, the write command is the command CMD illustrated in FIGS. 1 and 2, and the memory device is the memory device 300 illustrated in FIG. 2. The write command may be issued by the memory controller.

In step S2, a data determination block may receive data, e.g., write data, that is to be written in the memory cell array 310 of the memory device 300 when the write command is issued by the memory controller 200, and may determine whether a number of data having a specific logic level is less than a critical number N. In an example, the data determination block is the data determination block 250-1 or 250-2 illustrated in FIG. 9 or FIG. 10, and the data is the data DATA described with reference to FIG. 9 or FIG. 10. The data determination block may determine a number of bits in the data having a specific logic level, and determine whether the number of bits having the specific logic level is equal to or lower than the critical number N of correctable error bits. The critical number N of correctable error bits may be a maximum number of correctable error bits by an ECC block connected to the data determination block. In an example, the ECC block is the ECC circuit 240 illustrated in FIG. 7.

For example, when the specific logic level is a "0" level and the number of bits in the data having the 0 level is equal to or lower than the critical number N, the data determination block may output an address change signal to an address control block. In another example, when the specific logic level is a "1" level and a number of bits in the data having the 1 level is equal to or lower than the critical number N, the data determination block may output the address change signal to the address control block. In a specific example, when the data determination block is the data determination block 250-1 or 250-2 illustrated in FIG. 9 or FIG. 10, the address change signal is the address change signal ACS illustrated in FIG. 9 or FIG. 10, and the address control block is the address control block 230 illustrated in FIG. 7.

In step S3, the address control block may remap a write target address of a memory cell on an address of an adjacent memory cell (hereinafter, referred to as an "adjacent address") in response to the address change signal output by the data determination block.

In step S4, a datum, among the data, that was originally to be stored in the write target address, may be stored in the remapped address, i.e., the adjacent address, during the write operation.

In step S5, when the number of bits in the data having the specific logic level is higher than the critical number N, the datum may be stored in the original write target address. That is, the address remapping operation is not performed.

Hereinafter, operations for remapping the address and storing the data may be illustrated in detail with reference to FIGS. 12 to 14 according to an embodiment of the present disclosure.

Figure 12:
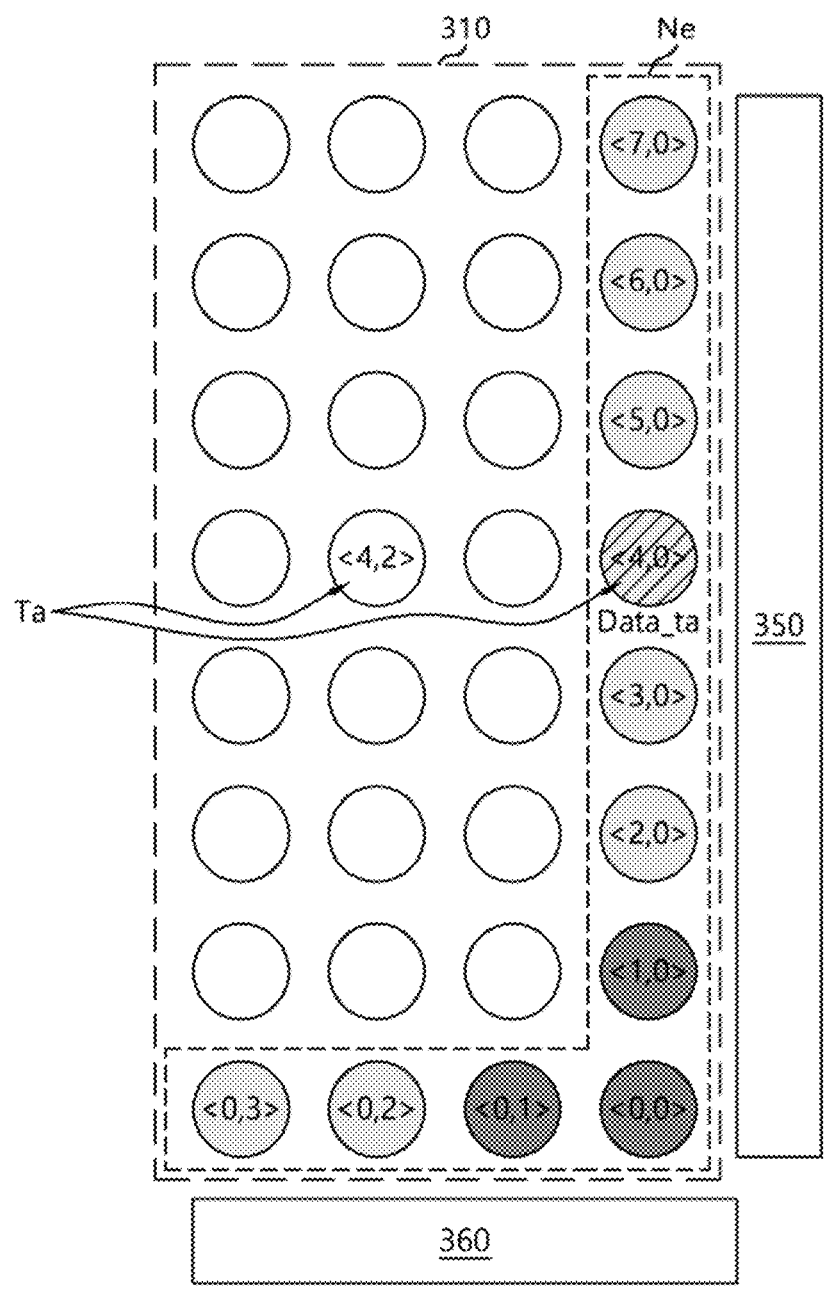
FIG. 12 illustrates a read operation of a resistive variable memory device in accordance with an embodiment of the present disclosure.

FIG. 12 illustrates a read operation of a resistive variable memory device in accordance with an embodiment of the present disclosure. As illustrated in FIG. 12, a memory cell array 310 may include 8 rows of memory cells and 4 columns of memory cells. A row decoder 350 and a column decoder 360 may be provided on edge portions of the memory cell array 310. For example, the row decoder 350 is provided adjacent to an outer column of the memory cell array 310, and the column decoder 360 is provided adjacent to an outer row of the memory cell array 310.

Figure 13:
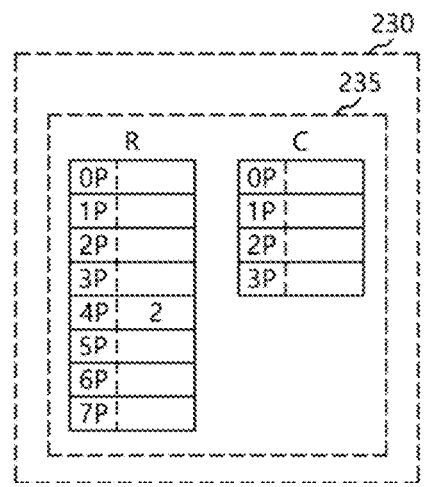
FIG. 13 is a mapping table illustrating operations for remapping an address in accordance with an embodiment of the present disclosure.

FIG. 13 is a mapping table illustrating operations for remapping an address in accordance with an embodiment of the present disclosure.

Figure 14:
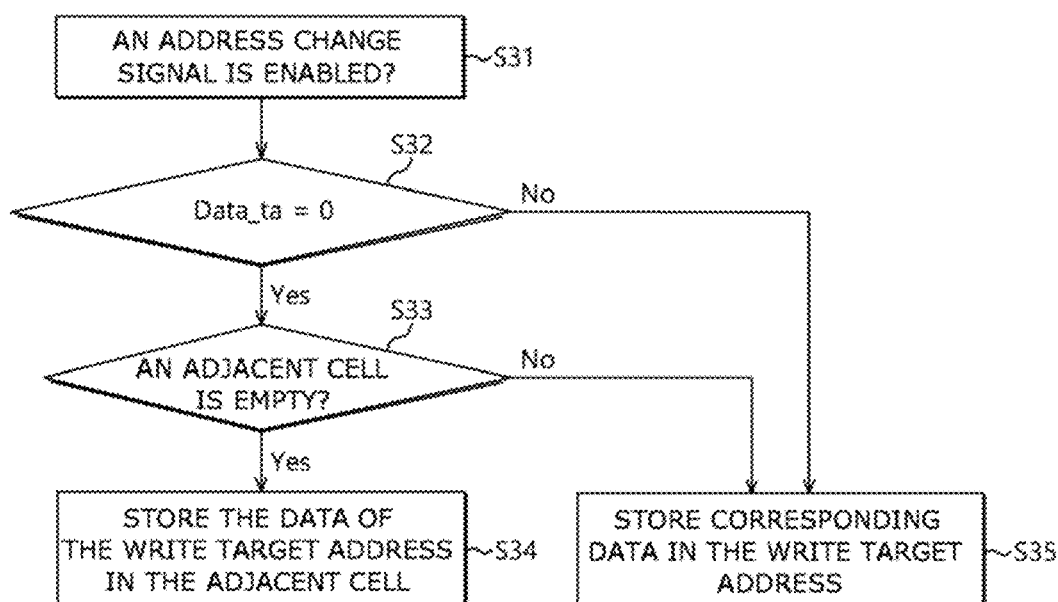
FIG. 14 is a flow chart illustrating operations performed in the flow chart illustrated in FIG. 11 according to an embodiment of the present disclosure.

FIG. 14 is a flow chart illustrating operations performed in steps S3 to S5 of FIG. 11 in further detail, according to a specific embodiment of the present disclosure.

Referring to FIGS. 12 to 14, in step S31 of FIG. 14, when a number of bits in data having a specific logic level is equal to or lower than a critical number N, an address change signal is enabled by a data determination block, and may be outputted to the address control block. The specific logic level may be a logic level having a relatively high error generation probability. For example, when the data can each have a "0" level or a "1" level and the specific logic level is the 0 level, the data with the 0 level may be more likely to be written erroneously, or more likely to be read erroneously, than the data with a "1" level.

In step S32, the data determination block may identify whether a level of a datum DATA_ta, which is to be written in a write target address Ta, corresponds to the specific logic level, e.g., the 0 level.

When the datum DATA_ta of the write target address Ta has the 0 level, in step S33, it may be determined whether an adjacent cell Ne is empty. The adjacent cell Ne may be a cell in the same row, or in the same column, as the write target address Ta. That is, it may be determined whether the adjacent cell Ne is storing a datum.

When the adjacent cell Ne corresponding to the same row or column as the write target address Ta is empty, that is, no datum is stored in the adjacent cell Ne, the datum DATA_ta of the write target address is written in the adjacent cell Ne in step S34.

For example, when the write target address Ta is <4,2> and the datum DATA_ta to be written into the write target address Ta has the specific logic level of 0, it may be determined whether the datum DATA_ta may be stored in one of the adjacent cell addresses <4,0> and <0,2>. The adjacent cell addresses <4,0> and <0,2> are determined to be empty by using one or more mapping tables, such as one or both of the mapping tables R and C illustrated in FIG. 13. When the row table R indicates that the adjacent row cell <4,0> is empty, the datum DATA_ta of the write target address Ta may be written in the adjacent row cell <4,0>.

In other words, the row table R can be used to track that the datum DATA_ta, initially destined for the write target address Ta of <4,2>, has been written in the adjacent row cell of <4,0>. For example, when the write target address Ta is remapped to an address of the adjacent row cell <4,0>, 2 may be written in a fourth page 4$p$ of the row table R. Each of the pages of the mapping tables R and C may store positions of the rewritten addresses in a type of code. For example, 2 being written in the fourth page 4$p$ of the row table R indicates that the datum DATA_ta, which was initially destined for a target memory cell <4,2> corresponding to write target address Ta, has been written in the adjacent row cell of <4,0>. Alternatively, various types of codes for representing remapped addresses may be stored in the mapping table R and C.

In an embodiment, the fourth page 4$p$ of the row table R is empty before 2 is written in the fourth page 4$p$. However, when the fourth page 4$p$ of the row table R is not empty, it may be determined whether a datum is already stored in a page of the column table C that corresponds to the write target address Ta, for example, a second page 2$p$ of the column table C. When no datum is stored in the second page 2$p$ of the column table C, the write target address Ta may be remapped to the address of the adjacent column cell <0,2>. That is, 4 may be written in the second page 2$p$ of the column table C, which indicates that the datum DATA_ta has been written to the adjacent column cell <0,2>.

When the level of the datum DATA_ta of the write target address Ta is not the specific logic level, e.g., not 0, in step S35, the datum may be stored in the write target address Ta without the address remapping operation. For example, when the specific logic level is 0, a logic level of 1 may correspond to a lower error generation probability than the specific logic level of 0. Accordingly, in an embodiment, the write target address Ta may not be remapped when the level of the datum DATA_Ta is 1, because the error generation probability of the datum DATA_Ta may be relatively low.

Further, when the adjacent cell Ne is not empty, in step S35, the datum DATA_Ta may be stored in the write target address Ta without the address remapping operation, regardless of whether the level of the data DATA_ta of the write target address Ta is 0.

Generally, a resistive variable memory device, particularly a phase changeable memory device, may have resistive characteristics, e.g., an electrical resistance, that change when a writing voltage is applied to the device. In contrast, the resistive characteristics of the phase changeable memory device are not supposed to be changed when a read voltage is applied to the device.

However, a relatively high read voltage may be applied to the adjacent cells Ne, which are adjacent to the control circuit block 320 such as the row decoder 350 and the column decoder 360, compared to other memory cells. Thus, each of the adjacent cells Ne may weaker to a read disturbance than other memory cells. For example, each of the adjacent cells Ne is more likely to receive a read voltage that is greater than a threshold voltage Vth of the adjacent cell Ne than other memory cells, which may erroneously change a resistance state of the adjacent cell Ne during a read operation.

In an embodiment, a phase change layer in each of the adjacent cells Ne may change into an amorphous state from a crystalline state when a voltage greater than the threshold voltage Vth is applied to the adjacent cell Ne. When, for example, the adjacent cell Ne stores a datum having the 0 level in the crystalline state, the relatively high read voltage may change the datum to the 1 level, corresponding to the amorphous state. Therefore, when a datum having the 0 level is inputted into the adjacent cell Ne, the error generation probability may be increased.

According to embodiments, when a number of data having the 0 level, which corresponds to the relatively high error generation probability, is no more than a critical number N of bits correctable by an ECC circuit, e.g., the ECC block 240, the ECC circuit may correct errors in the data even when the data having the 0 level is primarily arranged in the adjacent cells Ne. As a result of the error correction performed by the ECC circuit, the errors caused by the reading disturbance may be prevented.

Figure 15:
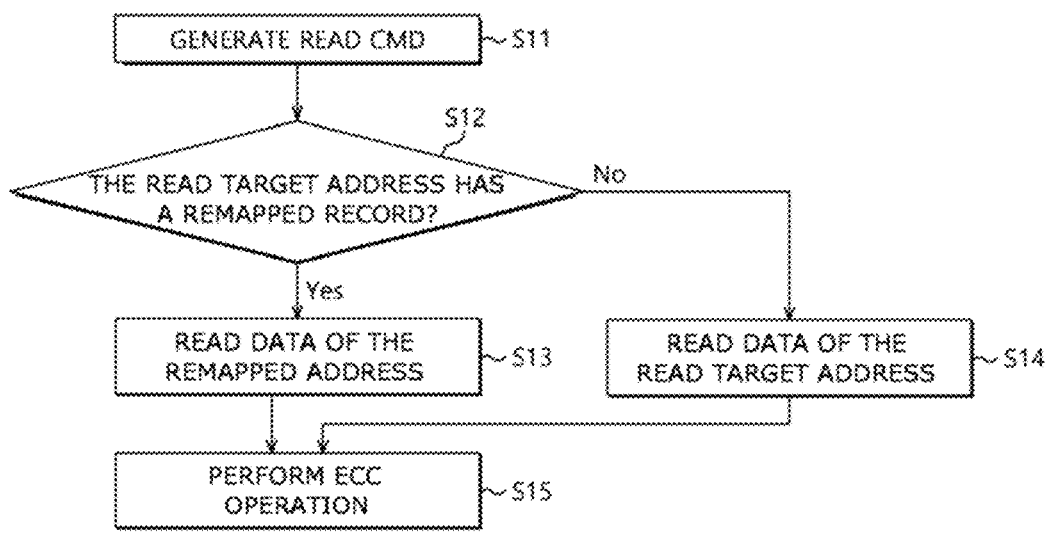
FIG. 15 is a flow chart illustrating a read operation of a resistive variable memory device in accordance with an embodiment of the present disclosure.

FIG. 15 is a flow chart illustrating a read operation of a resistive variable memory device in accordance with an embodiment of the present disclosure.

Referring to FIG. 15, in step S11, a memory controller may generate a read command READ CMD for reading data in the memory device. The read command READ CMD may specify a read target address of a memory cell from which a datum is to be read. In an embodiment, the memory controller and the memory device are respectively the memory controller 200 and the memory device 300 illustrated in FIGS. 1, 2, and 7.

In step S12, when the read command READ CMD is generated, it may be determined whether the read target address corresponds to remapping information, e.g., a remapping record, based on information recorded in a mapping table of an address control block. In an embodiment, the remapping information is a code written in the mapping table, which indicates that the read target address has been remapped to an address of an adjacent memory cell, and that a datum that was originally supposed to be stored in the memory cell corresponding to the read target address is actually stored in the adjacent memory cell. According to an embodiment, the mapping table is the mapping table 235 illustrated in FIG. 13, and the address control block is the address control block 230 illustrated in FIG. 7.

For example, referring back to FIGS. 12 and 13, when the read target address corresponds to the memory cell <4,2>, it may be determined whether the remapping information has been recorded in at least one page of the row table R and the column table C in the mapping table 235 corresponding to the memory cell <4,2>. When 2 is determined to have been recorded in the page 4$p$ of the row table, it can be noted that the target address <4,2> is remapped on the adjacent row cell <4,0>, and that the datum to be read is stored in the adjacent row cell <4,0>.

In step S13, when the read target address <4,2> is inputted and is determined to have been remapped, the address control block may select the remapped address, in order to read the datum stored in the remapped adjacent cell address <4,0>.

In step S14, when the remapping information is not identified, e.g., a code corresponding to the read target address is absent from a corresponding page of the mapping table 235, the datum stored in the memory cell corresponding to the read target address is read.

In step S15, an ECC operation may be performed on the read datum.

According to various embodiments, when write data having a specific logic level, for example, the 0 level, is written into a memory array, the data may be preferentially arranged in an adjacent cell region of the memory array until a number of data having the 0 level is equal to or lower than a critical number N of correctable error bits. Since the specific logic level is associated with a relatively high error generation probability, and the adjacent cell region is associated with a relatively high error generation probability, a read disturbance can be addressed and errors in the data may be totally corrected.

According to various embodiments, when a number of the data having the 0 level is equal to or lower than a critical number N of correctable error bits by the ECC circuit, the data having the 0 level may be written in adjacent cells having the high error generation probability by performing a remapping operation. When an error is issued in the read operation, the ECC circuit may correct the error to reduce the read disturbance.

Further, various embodiments may be applied when the number of the data having the 0 level is no more than the critical number N. Alternatively, when a number of the data having a 1 level is no more than the critical number N as described above with reference to FIG. 10, the read disturbance may be solved by performing a reversing operation using a reversing processor and data bus inversion (DBI) technology, which is disclosed in U.S. Publication No. 2018/0143922 that is incorporated herein by reference.

The above described embodiments of the present disclosure are intended to illustrate and not to limit the present disclosure. Various alternatives and equivalents are possible. The present disclosure is not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A memory controller comprising:
an address control block configured to remap a write target address to a remapping address, when a number of write data having a first logic level is within a correctable range and when a level of a datum corresponding to the write target address has the first logic level, wherein the first logic level has a higher error generation probability than a second logic level opposite to the first logic level, and
a data determination block configured to receive the write data, and to generate an address change signal by comparing the number of write data having the first logic level with the correctable range,
wherein the memory controller stores the write data in a memory device,
wherein the write target address indicates a memory cell located in an area with a first read error and the remapping address indicates a memory cell located in an area with a second read error that is higher than the first read error, and
wherein the address control block remaps the write target address based on the address change signal.

2. The memory controller of claim 1, wherein the memory device comprises:
a memory cell array including a plurality of memory cells; and
a control circuit block arranged at an edge portion of the memory cell array,
wherein the remapping address is an address of a memory cell adjacent to the control circuit block.

3. The memory controller of claim 1, wherein the address control block comprises a mapping table configured to store remapping information of the write target address.

4. The memory controller of claim 3, wherein the memory device comprises:
a memory cell array including a plurality of memory cells, the plurality of memory cells being arranged in a matrix shape with n rows and m columns, m and n being positive integers,
wherein the mapping table comprises a row table including n numbers of pages and a column table including m numbers of pages, and
wherein the remapping information of the write target address is stored in a selected one of the pages in the row table and the column table.

5. The memory controller of claim 1, further comprising:
an error correction code (ECC) circuit configured to detect and correct read data received from the memory device during a read operation.

6. The memory controller of claim 5, wherein the correctable range corresponds to a critical number of error correction bits of the ECC circuit.

7. The memory controller of claim 1, wherein the data determination block comprises:
a data level counting circuit configured to receive the write data and to generate an output code by counting the number of the write data having the first logic level; and
a comparison circuit configured to compare the output code of the data level counting circuit with a reference code encoded with the critical number of error correction bits of the ECC circuit, and to output the address change signal when the output code of the data level counting circuit is lower than the reference code.

8. A semiconductor memory system comprising:
a memory device including a memory cell array and a control circuit block, the memory cell array including a plurality of memory cells arranged in a matrix shape with n rows and m columns, m and n being positive integers, the control circuit block being arranged at an edge portion of the memory cell array; and
a memory controller configured to provide the memory device with write data, a read command, a write command, and addresses providing positions at which the write data is written in the memory device,
wherein the memory controller comprises:
an ECC circuit configured to correct read data;
a data determination block configured to generate an address change signal when a number of the write data having a first logic level is within a correctable range of the ECC circuit; and an address control block configured to remap a write target address with an address of a memory cell adjacent to the control circuit block in a write operation when a datum corresponding to the write target address has the first logic level and when the adjacent memory cell is empty, and to select, in a read operation, one of a read target address and a remapping address based on remapping information of the read target address.

9. The semiconductor memory system of claim 8, wherein the address circuit block comprises a mapping table configured to store remapping information of the write target address.

10. The semiconductor memory system of claim 8, further comprising:
a row table including n numbers of pages; and
a column table including m numbers of pages,
wherein the remapping information of the write target address is stored in a selected one of the pages of the row table and the column table.

11. The semiconductor memory system of claim 8, wherein the data determination block comprises:
a data level counting circuit configured to receive the write data and to generate an output code by counting a number of the write data having the first logic level; and
a comparison circuit configured to compare the output code of the data level counting circuit with a reference code encoded with a critical number of error correctable bits of the ECC circuit, and to output an address change signal when the output code of the data determination circuit is lower than the reference code,
wherein the address control block remaps the write target address based on the address change signal.

12. The semiconductor memory system of claim 8, wherein each of the memory cells comprises a variable resistor, a resistance state of the variable resistor being changed by an electrical pulse.

13. A method of driving a semiconductor memory system, the memory system including a memory device and a memory controller, the memory device including a memory cell array and a control circuit block, the memory cell array including a plurality of memory cells, the control circuit block being arranged at an edge portion of the memory cell array, the memory controller being configured to control operations of the memory device, the method comprising:
counting a number of write data having a first logic level;
determining whether the number of the write data having the first logic level is within a correctable range;
remapping a write target address on an address of one of the memory cells adjacent to the control circuit block when the number of the write data having the first logic level is determined to be within the correctable range and a datum corresponding to the write target address has the first logic level;
storing the datum of the write target address in the adjacent memory cell corresponding to the remapped address;
identifying, when a read command is issued, whether remapping information corresponds to a read target address by determining whether the remapping information is stored in a row table corresponding to the read target address or a column table corresponding to the read target address;
reading a datum in the adjacent memory cell based on the remapping information when the remapping information corresponds to the read target address; and
reading a datum in a target memory cell corresponding to the read target address when the remapping information does not correspond to the read target address,
wherein the method further comprises inputting the write data into the memory device when the memory controller issues a write command.

14. The method of claim 13, wherein remapping the write target address on the address of the adjacent memory cell further comprises:
determining whether the adjacent memory cell is empty when the datum of the write target address has the first logic level;
storing the datum of the write target address in the adjacent memory cell when the adjacent memory cell is determined to be empty;
storing the datum of the write target address in a target memory cell corresponding to the write target address when the datum has a second logic level that is different than the first logic level, when the adjacent memory cell address is not empty, or both.

15. The method of claim 13, wherein remapping the write target address on the address of the adjacent memory cell further comprises storing the remapping information in the memory controller.

16. The method of claim 15, wherein storing the remapping information comprises:
encoding row information of the write target address or column information of the write target address; and
storing the encoded information in one page among pages of a row table and pages of a column table, the pages of the row table respectively corresponding to a plurality of rows of the memory cell array, and the pages of the column table respectively corresponding to a plurality of columns of the memory cell array.

17. The method of claim 13, further comprising:
performing an ECC operation for detecting and correcting a read error in the adjacent memory cell or in the target memory cell.

* * * * *